United States Patent [19]
Choy

[11] Patent Number: 5,075,892
[45] Date of Patent: Dec. 24, 1991

[54] PARALLEL READ CIRCUIT FOR TESTING HIGH DENSITY MEMORIES

[75] Inventor: Yun-ho Choy, Seoul, Rep. of Korea

[73] Assignee: Samsung Electronics Co. Ltd.

[21] Appl. No.: 354,244

[22] Filed: May 19, 1989

[30] Foreign Application Priority Data

Dec. 31, 1988 [KR] Rep. of Korea .................... 88-18252

[51] Int. Cl.⁵ .......................................... G01R 31/28
[52] U.S. Cl. ...................................... 382/61; 371/68.1
[58] Field of Search ................... 371/21.1, 21.2, 21.3, 371/68.1; 365/201

[56] References Cited

U.S. PATENT DOCUMENTS

| | | | |
|---|---|---|---|
| 4,055,754 | 10/1977 | Chesley | 371/21.3 |
| 4,541,090 | 9/1985 | Shiragasawa | 371/21.2 |
| 4,654,849 | 3/1987 | White, Jr. et al. | 371/21.3 |
| 4,744,061 | 5/1988 | Takemae et al. | 365/201 |
| 4,768,194 | 8/1988 | Fuchs | 371/21.2 |
| 4,833,677 | 5/1989 | Jarwala et al. | 371/68.1 |
| 4,885,748 | 12/1989 | Hoffmann et al. | 371/21.3 |

*Primary Examiner*—Charles E. Atkinson

[57] ABSTRACT

A parallel read circuit for testing high density memories is disclosed which reduces testing time by increasing the simultaneous testing data imputted. Individual data line sense amplifiers are arrayed in parallel with corresponding multiplexers to amplify respective data bits from respective output data lines for each of the plural cell array blocks; data line comparators are connected at a position downstream of the individual data line sense amplifiers to compare the amplified data from said sense amplifiers per each separate cell array block and form primarily compared data, these primarily compared data are sent to the pertinent one of the data buses and individual output buffers are connected at a position downstream of the data buses to buffer further the test output from the data line comparators during a test mode in order to locate the specific location of defective memory block.

17 Claims, 3 Drawing Sheets

| test pattern inputs | DB1 ~ DB4 | Q | Q̄ | test results |
|---|---|---|---|---|
| all 1s | all 1s | 1 | 0 | good |
| all 0s | all 0s | 0 | 1 | good |
| all 1s or 0s | a portion 1(s) and the rest 0(s) | 0 | 0 | no good |

PARALLEL READ CIRCUIT FOR TESTING HIGH DENSITY MEMORIES

BACKGROUND OF THE INVENTION

1. Field of the Invention

The present invention relates to a parallel read circuit for testing high density semiconductor memories, and particularly to a parallel read circuit which reads out a larger quantity of data not dependent on the number of data buses in the chip under test by parallelly reading out plural bits of data from the memory cells provided with test pattern inputs for checking any existence of disorder in the manufactured high density memory chips, thereby effectively reducing the required testing time.

2. Description of the Art

Recently in the semiconductor-related manufacturing field, semiconductor memory elements with low power consumption, high operational speeds and high density have become of interest in accordance with advances in data information communication. A high level of manufacturing technology is required to produce such high density memories, and such memory scale requires a quality test before the products are shipped. However, the higher the density of the memory cell within a single chip, the more complicated the testing procedure for the cell. Furthermore, a more lengthy time is required for carrying out the testing. The required test time per circuit is related to productivity, and therefore, efforts for improving testing efficiencies is becoming of interest in direct relationship with increasing chip densitites.

Thus, testability (so called in the art), which includes controllability (the ability of controlling the internal structure from the input terminal of chip) and observability (the ability of observing the functional state of the internal structure from the output terminal of chip), needed to be increased.

However, viewed from economies of scale, which is the subject of the present invention, the conventional test scheme is constituted such that, in order to provide a minimum economy of scale especially for RAM (random access memory) elements, plural bits of data outputted from each cell array block are extracted one by one by means of a multiplexer; these bits are supplied through respective data buses to a comparator which is situated at an input terminal of an output buffer; this comparator compares the output data read from a predetermined data test pattern, thereby detecting any malfunction of any cell.

According to this scheme, one data bus can carry one data stream, and therefore, where plural bits of data are parallelly read out from respective cell arrays, the testable number of bits of data is limited to the number of the data buses extant, resulting in restriction of the time required to carrying out the testing of the array. This problem becomes more serious as the density of the memory elements increases.

SUMMARY OF THE INVENTION

Therefore, it is an object of the present invention to provide a parallel read circuit for testing high density memories wherein a larger quantity of data bits irrespective of the number of extant data buses can be parallelly tested simultaneously without seriously modifying the existing chip structure, thereby reducing the overall test time.

In achieving the above object, the parallel read circuit of the present invention includes an individual sense amplifier at each output data line of each cell array; the plural data bits obtained by accessing to each cell array are amplified and supplied to an corresponding front stage comparator provided with every cell array.

The cell arrays are all fed the same values of bits according to an predetermined test input pattern, and the comparator, into which the output data from the cell array blocks are fed, compares the plural bits and compares the correspondence between plural output data bits. By this process, the comparator outputs data resultant of this comparison and supplies it to the respective data buses.

A rear stage comparator is installed between the ends of the data buses and an input terminal of the output buffer and collectively compares the first comparison data transmitted via each pertinent data bus from said each front stage comparator of the cell arrays mentioned above. Thus, the rear stage comparator outputs the final results of data comparison for the respective cell array blocks and supplies it through the output buffer to an output node. As described above, the object of obtaining plural bits of data from each cell array can be achieved for the each data bus, and therefore, a larger quantity of data bits than the number of extant buses can be parallelly read in each test read cycle, thereby enormously reducing the testing time of a memory chip compared with the conventional method.

BRIEF DESCRIPTION OF THE DRAWINGS

The above object and other advantages of the present invention will become more apparent by describing the preferred embodiment of the present invention with reference to the attached drawings in which.

DETAILED DESCRIPTION OF THE PREFERRED EMBODIMENTS

Figure 1:
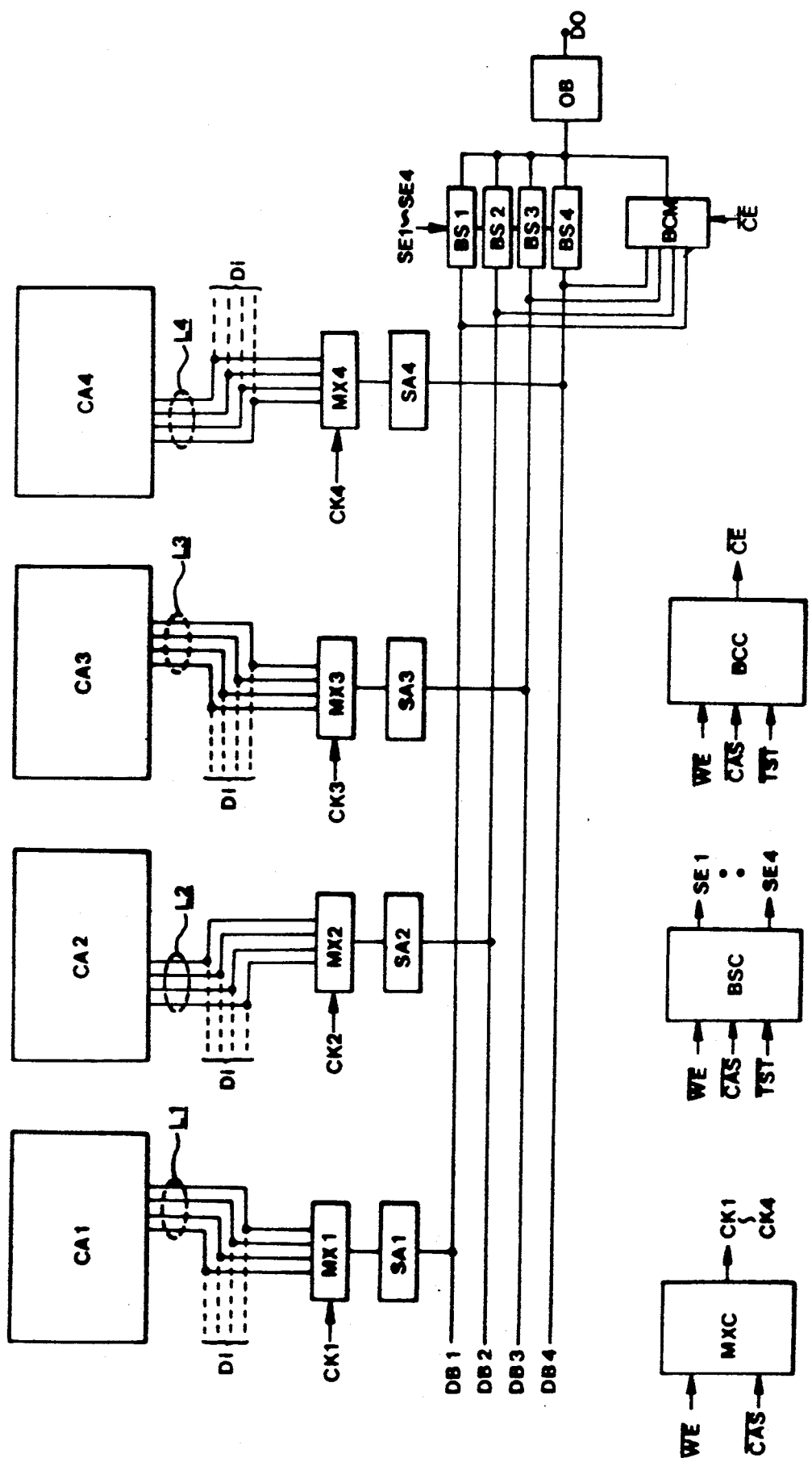
FIG. 1 illustrates the conventional parallel read circuit for testing high density memories.

FIG. 1 is an illustration of the conventional parallel read circuit of high density memories wherein a testing means of the parallel read type is shown. In FIG. 1 reference numbers CA1-CA4 indicate respective memory cell arrays connected through a plurality of input-/output data lines (to be called hereinafter "data line") L1-L4 to input buffers (not shown), and at the same time, are also connected to data line multiplexers MX1-MX4. The output lines of the multiplexers MX1-MX4 are connected respectively to sense amplifiers SA1-SA4.

Test pattern inputs Di having identical contents, are stored via respective parallel write paths into memory cells and accessed simultaneously in a parallel mode. When the output data of the cell array block CA1-CA4, designated by a column address signal $\overline{CAS}$, are supplied through data lines L1-L4 to multiplexers MX1-MX4 under the read mode ($\overline{WE}=1$), a multiplexer controller MXC generates control clocks CK1-CK4 for multiplexers MX1-MX4. Then, multiplexers MX1-MX4 respectively select a data line from among a plurality of the data lines L1-L4 (4- bit data lines are shown in FIG. 1, and output the data to the sense amplifiers SA1-SA4 where the data is amplified and sent to respective data buses DB1-DB4.

Further, data buses DB1-DB4 are connected respectively through bus selectors BS1-BS4 commonly to the input terminal of an output buffer OB, and are also connected to a bus comparator BCM. Bus comparator BCM compares the plural data supplied through the said data buses DB1-DB4 to check correspondence between the plural data, and the resultant data is transmitted to the output buffer OB.

In a the test mode ($\overline{TST}=0$) for testing the proper function of the memory cell array blocks CA1-CA4, a bus comparator controller BCC generates an enabling clock signal $\overline{CE}$ to activate the bus comparator BCM, while a bus selector controller BSC resets all the bus select enabling signals SE1-SE4 to disable all the bus selectors BS1-BS4. Accordingly, during testing, the output data selected by means of each of the multiplexers MX1-MX4 from among the plural output data which are read out from the respective cell arrays are respectively amplified in sense amplifiers SA1-SA4, and then, are supplied through the corresponding data buses DB1-DB4 to the bus comparator BCM. Then the bus comparator BCM compares said data from the respective data buses DB1-DB4 to check the correspondence therebetween, and the resultant data thus formed are sent to the output buffer and to an output node Do sequentially. The data which finally reach the output node Do respectively represent a GOOD or NO GOOD function state of each memory element under test.

Figures 2A, 2B:
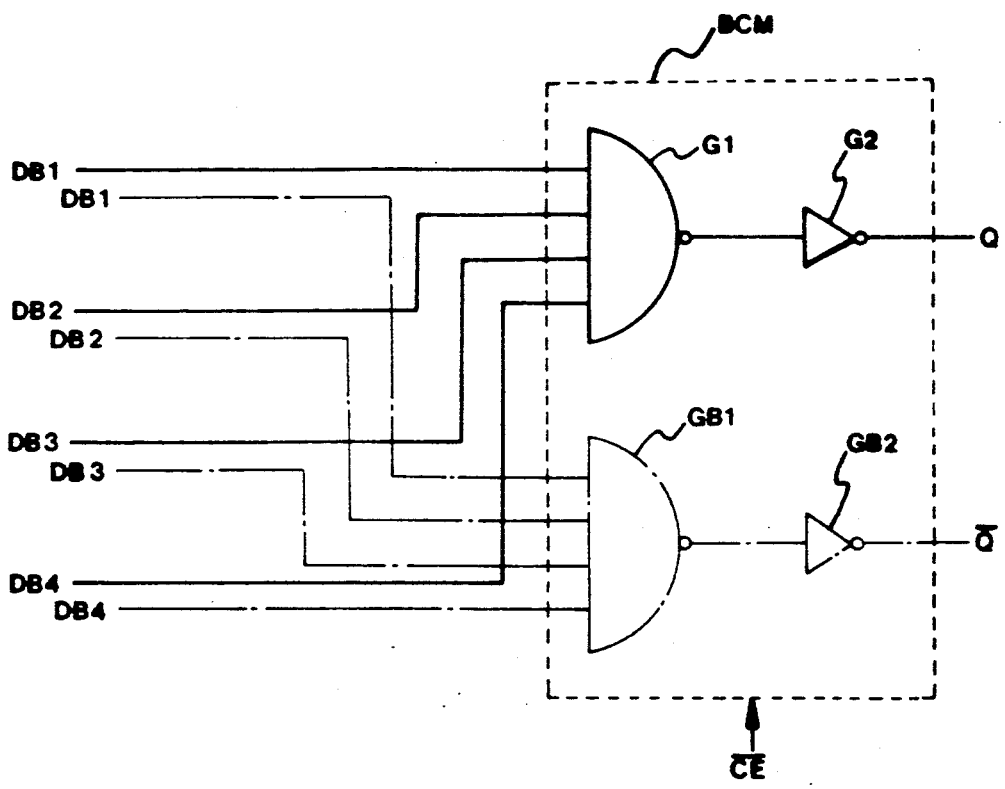
FIG. 2A is an exemplary view of the bus comparator as the test means among the circuits of FIG. 1.
FIG. 2B is a truth table for defining the actuation of the bus comparator illustrated in FIG. 2A.

The comparing operation of the bus comparator BCM will be described in more detail referring to FIG. 2. For the ease of illustration, the data buses DB1-DB4 are illustrated in positive buses in FIG. 1, but strictly speaking, they consist of the positive buses DB1-DB4 and negative buses (or complement buses) $\overline{DB1}$-$\overline{DB4}$, as shown in FIG. 2A.

The bus comparator BCM includes a four-input NAND gate G1 having positive buses DB1-DB4 as the input lines together with an inverter G2 for inverting the output from the NAND gate G1, and another four-NAND gate G1 having the negative buses $\overline{DB1}$-$\overline{DB4}$ as the input lines, together with an inverter GB2 for inverting the output from the NAND gate GB1. With such a constitution, in the case where test pattern inputs applied to all the memory cells are all "1"s, if all the output data appearing through data buses DB1-DB4 are "1"s, then as shown in FIG. 2B, the output of the bus comparator BCM will be Q=1, $\overline{Q}$=0, which represents a GOOD functional state of the tested cell array blocks. While, in the case where the test pattern inputs are all "0"s, if the output data appearing through data buses DB1-DB4 are "0"s, then the output of the bus comparator BCM, also as shown in FIG. 2B, will become Q=0, $\overline{Q}$=1, which also represents a GOOD functional state of the tested cell array blocks.

On the other hand, in spite of the fact that the test pattern inputs are all "1"s or "0"s, if the output data appearing through the data buses DB1-DB4 are partly "1"(s) and partly "0"(s) contrary to the above mentioned two cases, then the bus comparator BCM produces Q=$\overline{Q}$=0, which represents a NO GOOD functional state of the tested cell array blocks.

Now, the case where the circuit blocks of FIG. 1 is in a normal operation mode other than a test mode will be described. In a normal operation mode ($\overline{TST}=1$), the bus comparator controller BCC will force the bus comparator to be in a disabled state by setting the bus comparator enable clock $\overline{CE}$ to "1", while the bus selector controller BSC generates bus select enable signals SE1-SE4 at a predetermined sequence to activate the bus selectors BS1-BS4. Accordingly, during normal operation mode, each of the multiplexers MX1-MX4 connected respectively to each of the cell array blocks CA1-CA4 selects one of the plural data lines, and sends the data to the corresponding one of the sense amplifiers SA1-SA4 to be amplified. The data thus amplified are carried by the individual data buses DB1-DB4, but only the data on the data bus coupled with the activated bus selector can be selectively transmitted to the output buffer OB. Therefore, normally one bit of data in the memory element is accessed each time.

As will be understood by the above description, as shown in FIG. 1, one data bus carries one bit of data, and therefore, in the case where a test is to be made with plural bits of data from each cell array block by parallel - reading process, the testable number of bits during one test cycle is limited to the number of the data buses in the memory device under test. Therefore, too much time is required to complete the testing by accessing to all of the data information stored in all the cell array blocks in this manner.

Figure 3:
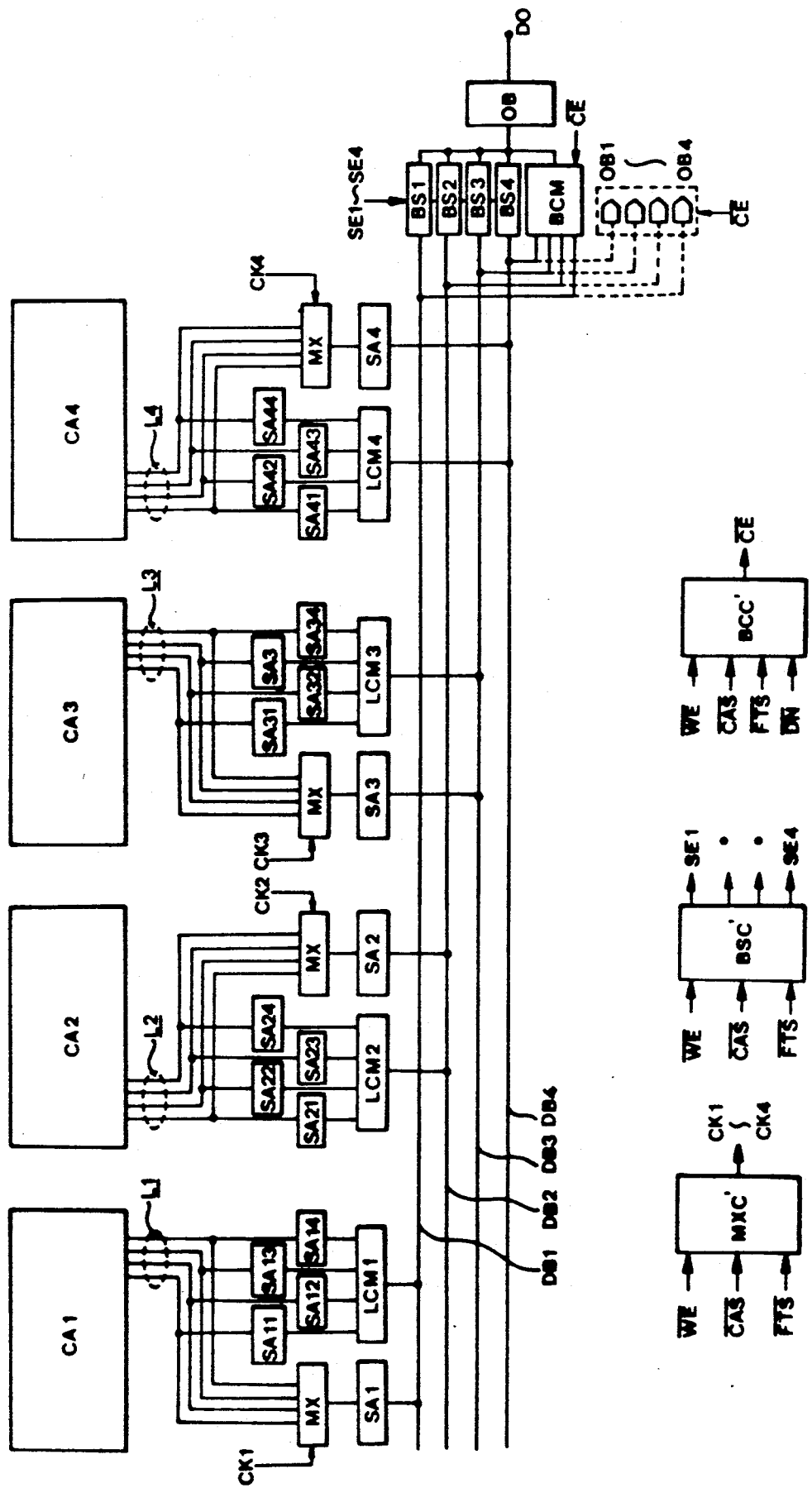
FIG. 3 is an illustration of the parallel read circuit for testing high density memories according to the present invention.

FIG. 3 illustrates a parallel read circuit for testing a memory, which is capable of overcoming the above described disadvantage according to the present invention. It should be noted that of the parts of FIG. 3, the same ones as those of FIG. 1 are indicated by the same reference symbols, while the ones similar in their functions are indicated by putting superscripts or bars to the same reference symbols of FIG. 1. The unique feature of the device of FIG. 3 which makes it superior from the device of FIG. 1 will be described below.

Individual data line sense amplifiers SA11-SA14, SA21-SA24, SA3-SA34, and SA41-SA44 are respectively connected to each data line of several groups of the plural data lines L1-L4, each group of which is connected respectively to each of the cell array blocks CA1-CA4. Thus, the outputs of said individual data line sense amplifiers, which are in a fast test mode ($\overline{FTS}=0$), are supplied to each data line comparators LCM1-LCM4 which are respectively provided to each cell array block CA1-CA4, so that the identicality between said plural data bits from each array block can be verified. The resultant data after the checking of the identicality of the outputs of the individual data line sense amplifiers is sent by data line comparators LCM1-LCM4 to a corresponding one of data buses DB1-DB4.

While the individual data line sense amplifiers are activated in the fast test mode ($\overline{FTS}=0$), the multiplexers MX1-MX4 for the plural-bit data lines L1-L4 are disabled as the clocks CK1-CK4 generated by the multiplexer controller MXC' are reset. In the normal operation mode ($\overline{FTS}=1$), if the multiplexer controller MSC' generates multiplexer enable clocks CK1-CK4 to activate the multiplexers MX1-MX4, the individual data line sense amplifiers are disabled in contrast to the case of the test mode.

In the fast test mode ($\overline{FTS}=0$), a bus selector controller BSC' resets the bus select enable signals SE1-SE4 so that the primarily compared output data from the data line comparators LCM1-LCM4 to the common output buffer OB is disabled. On the other hand, in the normal operation mode ($\overline{FTS}=1$), the bus select enable signals SE1-SE4 are adapted to enable one of said bus selectors BS1-BS4, and accordingly, the bit data of the normal reading mode, which are selected by the multiplexers MX1-MX4 and amplified by the sense amplifiers SA1-SA4, are sent through the activated bus selectors BS1-BS4 to the common output buffer OB.

In addition to the common output buffer OB, a plurality of individual output buffers OB1-OB4 may be used so that two types of the output buffers can be accessed alternatively according to different testing conditions. That is, each of data buses DB1-DB4 is directly connected to the individual output buffers OB1-OB4 so that, in the fast test mode, the primarily compared output data from each of the data line comparators LCM1-LCM4 are sent to the corresponding one of the individual output buffers OB1-OB4, thereby obtaining separate test results for the respective cell array blocks simultaneously. Further, as a testing facility, a data bus comparator BCM is installed so that it could be used alternatively with the individual output buffers OB1-OB4 according to different testing conditions. That is, the data buses DB1-DB4 are commonly connected to the data bus comparator BCM, so that, in the fast test mode, the primarily compared output data from the respective data line comparators LCM1-LCM4 should be compared again in the data bus comparator BCM to form one final test result for the entire of a memory device. This final test result is transmitted through the common output buffer OB to the output node Do.

The aforementioned data bus comparator BCM is controlled by means of a bus comparator controller BCC' which receives from an external source a fast test mode defining clock $\overline{FTS}$ and a test output amount decision clock DN. That is, in the fast speed test mode ($\overline{FTS}=0$), if the level of the $\overline{DN}$ is a logic "0", the bus comparator controller BCC' generates a clock ($\overline{CE}=0$) for enabling the data bus comparator BCM to activate, and at the same time, disabling the individual output buffers OB1-OB4, thereby giving one test output for the entire of a memory device correspondingly with the test pattern input data. On the other hand, in the fast test mode ($\overline{FTS}=0$), if the level of the clock $\overline{Dn}$ is a logic "1", the bus comparator controller BCC' makes the bus comparator enable signal $\overline{CE}$ set to a logic "1" ($\overline{CE}=1$), so that the data bus comparator BC is disabled, and that the individual output buffers OB1-OB4 are correspondingly enabled. Accordingly, the primarily compared output data from the line comparators LCM1-LCM4 transmitted through the data buses DB1-DB4 are not compared again in the data bus comparator BCM, but are applied directly to the individual output buffers OB1-OB4, thereby making it possible to obtain separate test outputs for the respective cell array blocks of the memory device.

According to one embodiment of the present invention as described above, in a parallel read circuit for testing high density memories where a plurality of cell array blocks are activated and each cell array block is accessed by means of a plurality of the input/output data lines L1-L4 as in the conventional circuit, the accessed data from each block are sent through the data lines to the individual data line sense amplifiers SA1-1-SA14, ..., and, SA41-SA44, in response to the fast test mode defining clock $\overline{FTS}$, and the transmitted data are amplified by said individual data sense amplifiers. The data thus amplified are compared by the data line comparators LCM1-LCM4 to form primarily compared data, and these primarily compared data are again compared by the data bus comparator BCM to form secondarily compared data. The resultant data is supplied to the common output buffer OB.

Based on this test procedure, a plurality of bits of data from each cell array block are transmitted through a single data bus, and accordingly, a larger number of data bits than the number of the installed data buses can be parallelly tested within each single test cycle, thereby making it possible to significantly reduce the testing time required.

Further, by appliance of the test output amount decision clock signal ($\overline{DN}=1$), the data from the respective data buses are not compared in the data bus comparator BCM, but are transmitted to the individual output buffers OB1-OB4, so that the data from the data line comparators LCM1-LCM4 can be directly outputted. In this way, in case a functional disorder is detected in some cell array block, the location of the bad cell array block can be easily and specifically pointed out.

On the other hand, in a normal operation mode ($\overline{FTS}=1$), the individual data line sense amplifiers SA11-SA14, SA21-SA24, SA31-SA34, and SA41-SA44 are disabled, and the data are read out in such a manner that one of the plural output data lines from each block is selected by the respective multiplexers MX1-MX4, then the selected data is amplified in the following sense amplifiers SA1-SA4, and then each output from said sense amplifiers is supplied through the corresponding data buses DB1-DB4 to input terminals of the bus selectors BS1-BS4. Then the data signal from an activated one of the bus selectors BS1-BS4 is supplied through a common output buffer OB to the output node DO, thereby completing the accessing operation of one bit.

What is claimed is:
1. A parallel read circuit for testing high density memories, comprising:
 a plurality of cell array blocks activated simultaneously during a read cycle;
 a plurality of input/output lines connected with said respective cell array blocks, for transmitting a predetermined test pattern to said cell array blocks during a write cycle and transmitting cell data read out from said cell array blocks in response to said predetermined test pattern during said read cycle;
 a plurality of data buses, one each for a corresponding one of said cell array blocks, for bussing said cell data loaded on a selected one of said input/output data lines;
 a data bus comparator for comparing data loaded on said data buses to generate a test output;
 a common output buffer for buffering commonly the respective data loaded on said data buses during a normal mode and said test output during a test mode;
 a plurality of individual data line sense amplifiers coupled to corresponding ones of said input/output data lines, said sense amplifiers amplifying respective said cell data loaded on said corresponding ones of said input/output data lines during said test mode; and
 a plurality of data line comparators, one each for a corresponding one of said cell array blocks, for comparing said amplified data from said sense amplifiers per each separate cell array block to form primarily compared data to be sent to a corresponding one of said data buses.

2. A parallel read circuit for testing high density memories as set forth in claim 1, further comprising a plurality of individual output buffers connected to respective said data buses to buffer individual test output from respective said data line comparators.

3. A parallel read circuit according to claim 2, further comprising means for activating one of said data bus comparator and said plurality of output buffers.

4. A parallel read circuit according to claim 1, further comprising means for activating said data bus comparator during a test mode.

5. A parallel read circuit according to claim 1, further comprising a plurality of bus selectors coupled to corresponding ones of said data bus.

6. A parallel read circuit according to claim 5, further comprising means for deactivating said bus selectors and for activating said data bus comparator during said test mode.

7. A parallel read circuit according to claim 1, further comprising:
  a plurality of multiplexers, one each for a corresponding one of said cell array blocks, each of said multiplexers coupled to receive data from said input/output data lines of said corresponding cell array block to provide multiplexed data; and
  a plurality of second sense amplifiers coupled to corresponding ones of said multiplexers for amplifying the multiplexed data output from said multiplexers.

8. A parallel read circuit according to claim 7, further comprising means for deactivating said multiplexers during said test mode.

9. A parallel read circuit for testing high density memories, comprising:
  a plurality of memory cell array blocks;
  a plurality of input/output data lines coupled to each of said memory cell array blocks;
  a plurality of sense amplifiers for each of said memory cell array blocks, said sense amplifiers being coupled to corresponding ones of said input/output data lines to amplify data from said input/output data lines;
  a plurality of data line comparators, one each for a corresponding one of said memory cell array blocks, each of said data line comparators comparing said amplified data from said sense amplifiers of said corresponding memory cell array block to form primarily compared data;
  a plurality of data buses coupled to corresponding ones of said data line comparators for bussing the respective primarily compared data; and
  data bus comparator means for comparing the primarily compared data on said data buses.

10. A parallel read circuit according to claim 9, further comprising an output buffer coupled to said data bus comparator means.

11. A parallel read circuit according to claim 9, further comprising a plurality of output buffers coupled to corresponding ones of said data buses;

12. A parallel read circuit according to claim 11, further comprising means for activating one of said data bus comparator means and said plurality of output buffers.

13. A parallel read circuit according to claim 9, further comprising means for activating said data bus comparator means during a test mode.

14. A parallel read circuit according to claim 9, further comprising a plurality of bus selectors coupled to corresponding ones of said data buses.

15. A parallel read circuit according to claim 14, further comprising means for deactivating said bus selectors and for activating said data bus comparator means during a test mode.

16. A parallel read circuit according to claim 9, further comprising:
  a plurality of multiplexers, one each for a corresponding one of said memory cell array blocks, each of said multiplexers coupled to receive data from said input/output data lines of said corresponding memory cell array block to provide multiplexed data; and
  a plurality of second sense amplifiers coupled to corresponding ones of said multiplexers for amplifying the multiplexed data output from said multiplexers.

17. A parallel read circuit according to claim 16, further comprising means for deactivating said multiplexers during a test mode.

* * * * *